(12) United States Patent
Ho et al.

(10) Patent No.: US 11,886,121 B2
(45) Date of Patent: Jan. 30, 2024

(54) METHOD FOR FORMING PATTERNED PHOTORESIST

(71) Applicant: TAIWAN SEMICONDUCTOR MANUFACTURING CO., LTD., Hsinchu (TW)

(72) Inventors: Chun-Chih Ho, Taichung (TW); Ching-Yu Chang, Yilan County (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 411 days.

(21) Appl. No.: 16/885,077

(22) Filed: May 27, 2020

(65) Prior Publication Data
US 2021/0063888 A1    Mar. 4, 2021

Related U.S. Application Data

(60) Provisional application No. 62/894,367, filed on Aug. 30, 2019.

(51) Int. Cl.
*G03F 7/36* (2006.01)
*H01L 21/027* (2006.01)

(52) U.S. Cl.
CPC ............ *G03F 7/36* (2013.01); *H01L 21/0274* (2013.01)

(58) Field of Classification Search
CPC .................................... G03F 7/40; G03F 7/36
See application file for complete search history.

(56) References Cited

U.S. PATENT DOCUMENTS

| | | | |
|---|---|---|---|
| 6,767,693 B1 * | 7/2004 | Okoroanyanwu | ........ G03F 7/26 430/311 |
| 10,056,256 B2 | 8/2018 | Lai et al. | |
| 2008/0241742 A1 * | 10/2008 | Hoshino | ............... G03F 7/2041 549/555 |
| 2010/0330471 A1 | 12/2010 | Bae et al. | |
| 2016/0097979 A1 | 4/2016 | Tsunoda et al. | |

FOREIGN PATENT DOCUMENTS

| | | |
|---|---|---|
| CN | 105575797 A | 5/2016 |
| KR | 20070075817 A | 7/2007 |
| KR | 20110002798 A | 1/2011 |
| KR | 20160041000 A | 4/2016 |
| TW | 201801139 A | 1/2018 |

OTHER PUBLICATIONS

M. D. Smith et al., "Optimization of a virtual EUV photoresist for the trade-off between throughput and CDU", Advances in Resist Materials and Processing Technology XXX. (2013).

* cited by examiner

*Primary Examiner* — Daborah Chacko-Davis
(74) *Attorney, Agent, or Firm* — Maschoff Brennan

(57) ABSTRACT

A method of forming a patterned photoresist layer includes the following operations: (i) forming a patterned photoresist on a substrate; (ii) forming a molding layer covering the patterned photoresist; (iii) reflowing the patterned photoresist in the molding layer; and (iv) removing the molding layer from the reflowed patterned photoresist. In some embodiments, the molding layer has a glass transition temperature that is greater than or equal to the glass transition temperature of the patterned photoresist. In yet some embodiments, the molding layer has a glass transition temperature that is 3° C.-30° C. less than the glass transition temperature of the patterned photoresist.

20 Claims, 16 Drawing Sheets

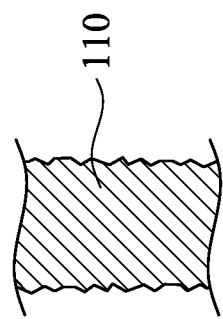
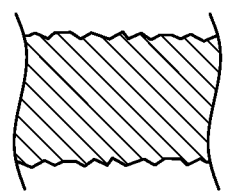
Fig. 4

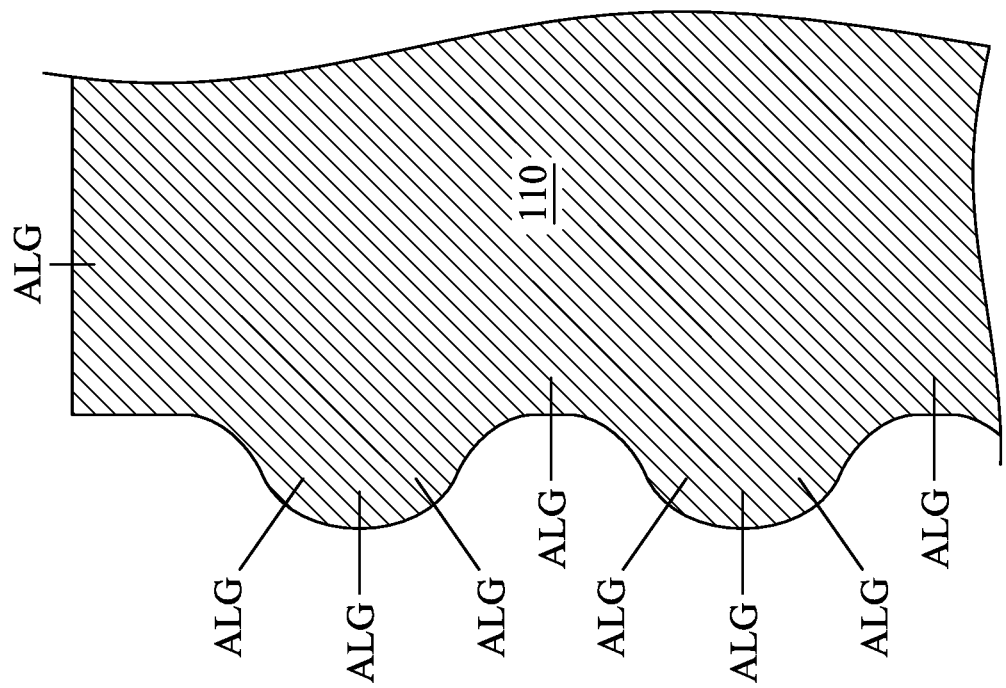
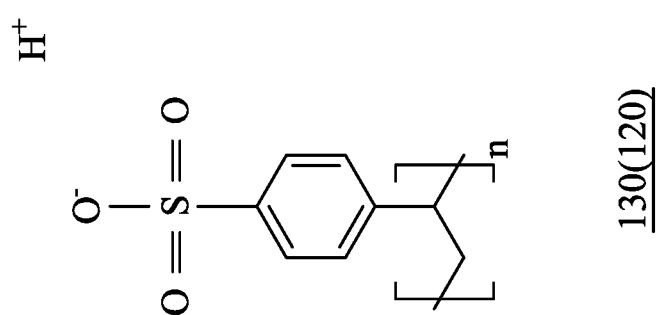
Fig. 13

METHOD FOR FORMING PATTERNED PHOTORESIST

This application claims priority to U.S. Provisional Application Ser. No. 62/894,367, filed Aug. 30, 2019, which is herein incorporated by reference in its entirety.

BACKGROUND

The semiconductor integrated circuit (IC) industry has experienced rapid growth. Technological progress in IC manufacture has produced several generations of ICs, and each generation fabricates smaller and more complex circuits than the previous generation. Several advanced techniques have been developed to implement technique nodes with smaller feature sizes. For instance, extreme ultraviolet (EUV) technologies have been applied in the pattern formation of the photoresist. Although the EUV technologies and the photoresist material have contributed to the shrinkage of the critical dimension of the circuit, these technologies have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-9 collectively illustrate more detailed manufacturing methods associated with the method of FIG. 1 in accordance with various embodiments of the present disclosure.

FIGS. 11-15 schematically depict the cross-sectional views in various process stages of the method of FIG. 10

DETAILED DESCRIPTION

Figure 1:
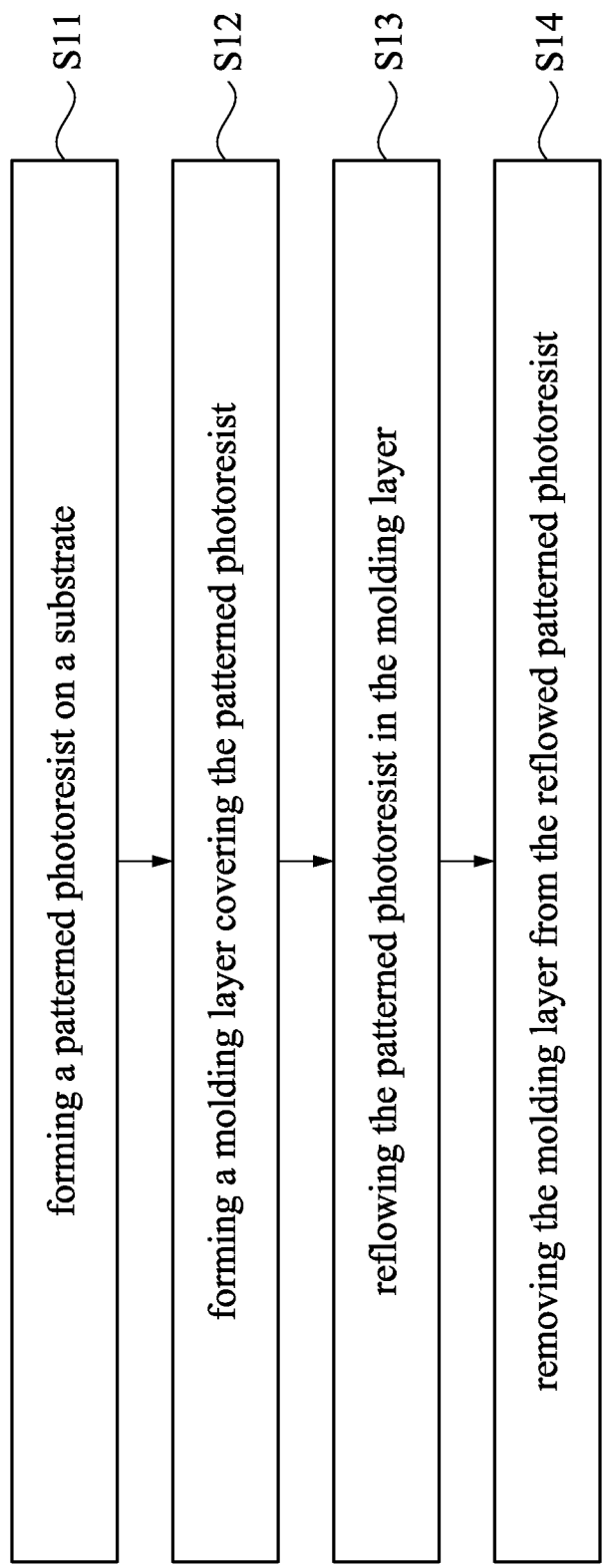
FIG. 1 is a flow chart illustrating a method according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The semiconductor industry has continually improved the speed and power of integrated circuits (ICs) by reducing the size of components within the ICs. Several advanced techniques have been developed to implement technique nodes with smaller feature sizes. One of the key points is the photoresist and the extreme ultraviolet (EUV) technologies. Although the EUV exposing technologies have manufactured photoresists with linewidth of several nanometers, the throughput is the major issue in terms of the manufacturing cost. The photoresist material suitable for the EUV exposure typically needs a high dose of exposure in terms of an accuracy pattern. The high dose of exposure requires high power of the light source for the purpose of increasing manufacturing throughput. The power of the light source in EUV equipment, however, has merely increased marginally in recent years. Since the power of light source is limited, the exposing duration of time must to be increased, which suffers the manufacturing throughput and is unfavorable to the manufacturing cost.

Another one of the solutions turns to the composition of the photoresist in pursuit of high throughput. For example, the photo-acid generator (PAG) could be possibly improved to become more efficient; or the loading to the photo-acid generator could be increased, accompanying with changes in other components; or the acid-labile groups (ALG) of the photoresist could be improved to become more sensitive. However, all of the aforementioned approaches require a long-term development and strict verifications in the manufacturing line. According to one of the aspect of the present disclosure, the manufacturing throughput is increased by post-treatments, which is cost-effective and compatible with the current process of forming photoresist.

The following disclosure provides many different embodiments or examples for implementing different features of the present disclosure. Specific examples of components and permutations are described below to simplify the disclosure of the present disclosure. Of course, the examples are merely examples and are not intended to be limiting. For example, in the following description, the disclosure of the first feature being formed on or above the second feature includes an embodiment in which the first feature is in direct contact with the second feature, and may also include an embodiment in which the first feature is not in direct contact with the second feature.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

FIG. 1 is a flow chart illustrating a method 10 according to various embodiments of the present disclosure. The method 10 may be a method of forming a patterned masking layer such as for example a patterned photoresist layer. FIGS. 2-9 collectively illustrate more detailed manufacturing methods associated with the method 10 of FIG. 1 in accordance with various embodiments of the present disclosure. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated acts can be further divided into sub-acts in some implementations, while in other implementations some of the illustrated acts can be carried out concurrently with one another.

Figure 2:
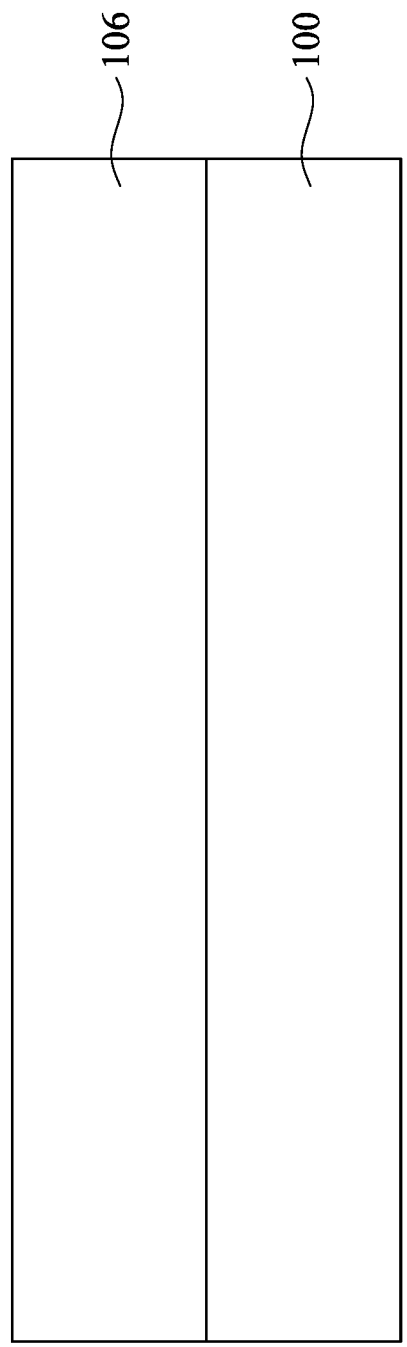
Figure 3:
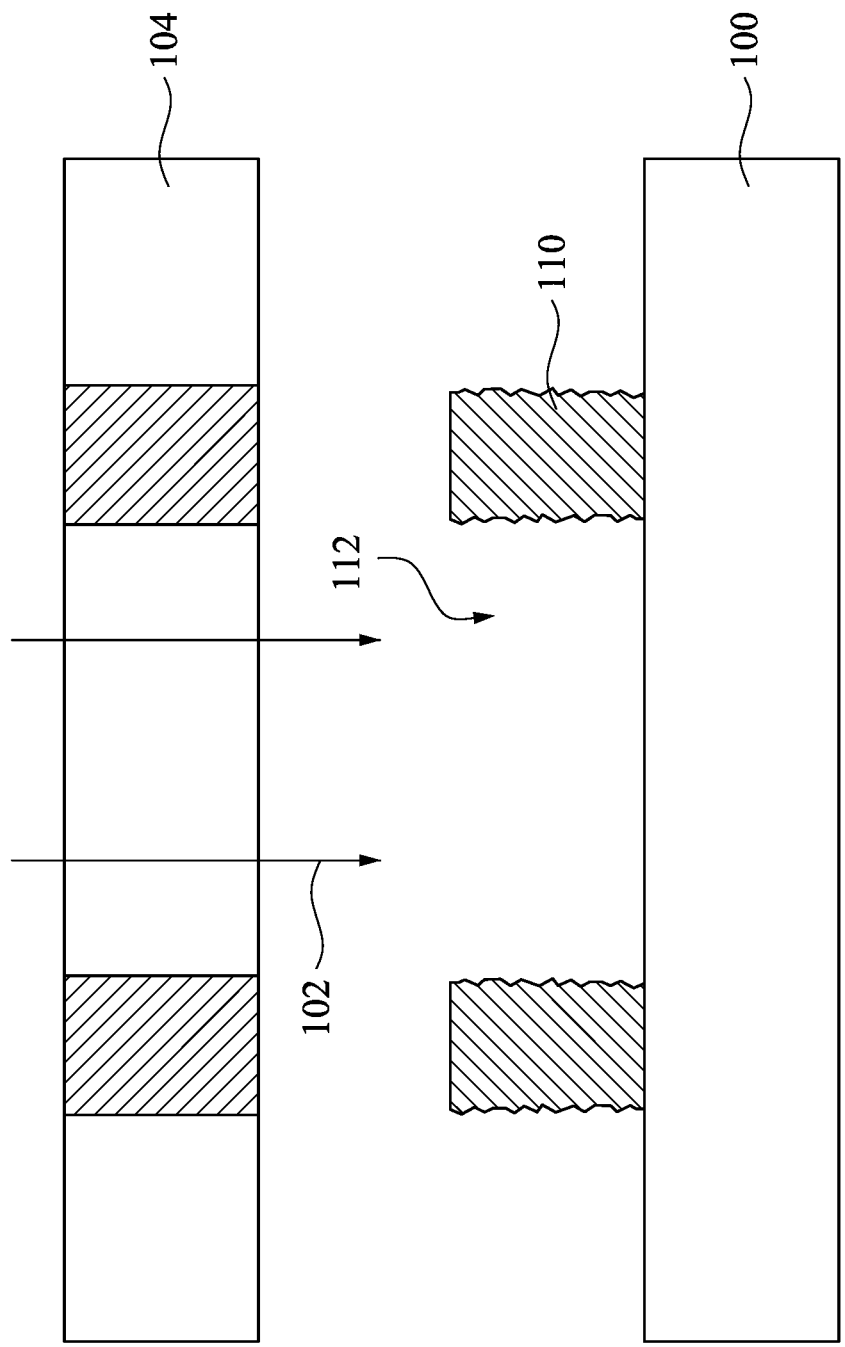

Referring to FIG. 1, the method 10 includes an operation S11 of forming a patterned photoresist on a substrate. In the present disclosure, the terms "patterned photoresist" and "patterned photoresist layer" may be alternately used. FIGS. 2-3 are cross-sectional views schematically depicting detailed steps to implement the operation S11 according to some embodiments of the present disclosure. As shown in FIG. 2, a photoresist layer 106 is formed on a substrate 100 in a blanket manner. In specifics, a photoresist solution may be applied (e.g., coating) on the substrate 100, and followed by a drying process to form the photoresist layer 106 which is blankety formed on the substrate 100.

In various embodiments, the substrate 100 may include a semiconductor substrate. The semiconductor substrate, for example, may include silicon. In some embodiments, the semiconductor substrate may include other elementary semiconductor such as for example germanium. In yet some embodiments, the semiconductor substrate may include an alloy semiconductor such as for example silicon germanium, silicon germanium carbide, gallium indium phosphide and the like. In yet some embodiments, the semiconductor substrate may include compound semiconductor such as for example gallium arsenic, silicon carbide, indium phosphide, indium arsenide and the like. In yet some embodiments, the semiconductor substrate may include a semiconductor-on-insulator (SO1) structure. In yet some embodiments, the semiconductor substrate may include an epitaxial layer overlying a bulk semiconductor material.

In some embodiments, the substrate 100 may further include a bottom anti-reflective layer (not shown) over the semiconductor substrate. The bottom anti-reflective layer may work to prevent the uncontrolled and undesired reflection of energy (e.g., light) such as light back into the overlying photoresist during an exposure of the photoresist, thereby preventing the reflecting light from causing reactions in an undesired region of the photoresist. Additionally, the bottom anti-reflective layer may be used to provide a planar surface over the semiconductor substrate, helping to reduce the negative effects of the energy impinging at an angle.

In some embodiments, the photoresist layer 106 may be a chemical amplified photoresist. The chemical amplified photoresist, for example, may include polymeric substance with additives including photo acid generator (PAG), quencher, etc. The polymeric substance includes polymer chains having hydrophobic acid-labile groups (ALGs), which is capable of being transformed into hydrophilic groups by reaction with acids (e.g., protons ($H^+$)).

Thereafter, as shown in FIG. 3, an exposure process and a developing process are carried out to form a patterned photoresist layer 110. According to some embodiments of the present disclosure, the exposure process may include a step of exposing the photoresist layer 106 through a reticle (i.e., photomask) 104 by using an extreme ultraviolet (EUV) beam 102 with a wavelength of about 13.5 nm or less. The reticle 104 has a plurality of transparent regions through which the EUV beam 102 transmits to the photoresist layer 106. In some examples, as the photoresist layer 106 is illuminated by the EUV beam 102, the PAGs in the photoresist layer 106 produce acids, which release protons ($H^+$). The released protons react with the hydrophobic ALGs of the photoresist layer 106 so as to convert the hydrophobic ALGs into hydrophilic groups. In some embodiments, the EUV beam 102 is supplied with a dose of less than a saturation value in terms of the critical dimension uniformity (CDU) in order to increase the manufacturing throughput. In examples, the dose of the EUV beam 102 may be equal to or less than 40 $mJ/cm^2$, for example 30 $mJ/cm^2$, 20 $mJ/cm^2$, 10 $mJ/cm^2$ or less. Reference is continuously made to FIG. 4, which is a top view schematically showing the patterned photoresist layer 110. After the developing process, the formed patterned photoresist layer 110 has a rough edge (namely, "line edge roughness" (LER)). In specifics, the rough edge or sidewall of the patterned photoresist layer 110 has a number of micro protrusions and micro cavities (or recesses). Without being bonded to any theory, it is believed that a low EUV dose is insufficient to adequately convert the hydrophobic ALGs at the edge of the exposed region into hydrophilic groups. The rough edge of the patterned photoresist layer 110 is undesirable because this rough edge considerably decreases the accuracy of the fabricated circuit and lowers the manufacturing yield. However, the low EUV dose may significantly increase the manufacturing throughput. According to one of the aspects of the present disclosure, the benefits of the usage of the low EUV dose is gained, but the drawbacks of the LER issue is improved or remedied by the following processes.

In some embodiments, the patterned photoresist layer 110 includes a plurality of apertures 112 exposing the substrate 100. Although FIGS. 3 and 4 depict only an aperture 112 and a simple pattern of the patterned photoresist layer 110, it is noted the pattern of the patterned photoresist layer 110 may be complex and include a number of regular or irregular apertures 112.

Figure 5:
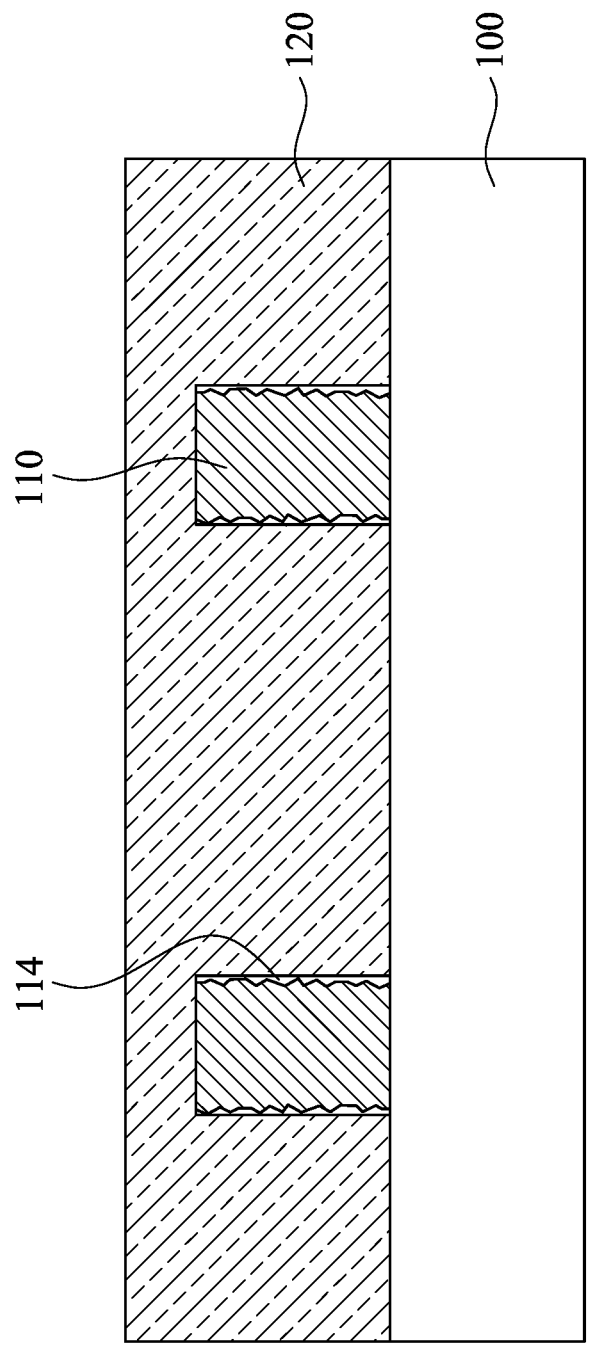

Referring back to FIG. 1, the method 10 proceeds to operation S12 by forming a molding layer covering the patterned photoresist. FIG. 5 is a cross-sectional view schematically showing the structure after the operation S12 is carried out, according to some embodiments of the present disclosure. As shown in FIG. 5, a molding layer 120 is formed covering the patterned photoresist layer 110. In examples, a solution containing a molding material may be applied (e.g., coating) to form a layer of molding solution which covers the patterned photoresist layer 110 on the substrate 100. Thereafter, a drying process may be carried out to remove the solvent in the molding solution so as to form the molding layer 120.

In some embodiments, the molding layer 120 does not completely fill the micro cavities or recesses on the edge of the patterned photoresist layer 110. Accordingly, there exists tiny space 114 between the molding layer 120 and the rough sidewall of the patterned photoresist layer 110, as shown in FIG. 5. In specifics, the molding solution may have a relatively higher surface tension, and therefore the applied molding solution does not completely fills the micro cavities or recesses on the rough sidewall of the patterned photoresist layer 110. As a result, after the molding solution is dried, the tiny space is still present in between the molding layer 120 and the sidewall of the patterned photoresist layer 110.

However, in yet some embodiments, the molding layer 120 may fill up the micro cavities or recesses on the sidewall of the patterned photoresist layer 110, which will be described in detail hereinafter in connection with FIGS. 8 and 9.

In some embodiments, the molding layer 120 is formed with a thickness greater than the thickness of the patterned photoresist layer 110. Accordingly, the apertures 112 of the patterned photoresist layer 110 are filled up with the molding layer 120 in some examples of the present disclosure. In other words, the patterned photoresist layer 110 may be encapsulated in the molding layer 120.

In some embodiments, the molding layer 120 may be made with a polymer which has a repeating unit including at least one of a hydroxyl functionality, a carboxylate functionality, a carboxylic acid functionality, an amine functionality, and an amide functionality. In examples, the polymer of the molding layer 120 may be poly(acrylic acid), poly(methacrylic acid), poly(acrylamide), poly(N-vinyl acetamide), poly(vinyl alcohol), poly(4-vinylphenol), poly(4-styrenesulfonic acid), poly(2-acrylamido-2-methyl-1-propanesulfonic acid), or a combination thereof. In specifics, the polymer may be represented by the following Formulas (1)-(8):

Formula (1)

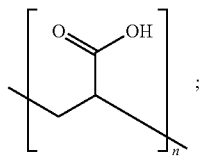

Formula (2)

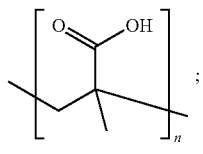

Formula (3)

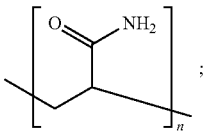

Formula (4)

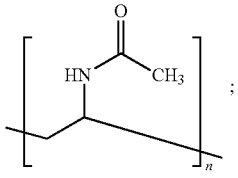

Formula (5)

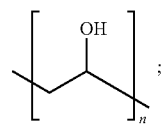

Formula (6)

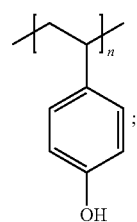

Formula (7)

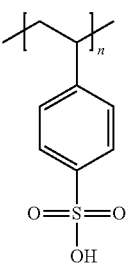

and

Formula (8)

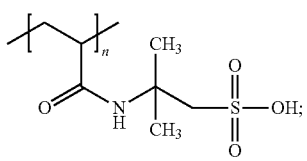

in which n is an integral number ranged from 3-20,000. In yet some embodiments, the polymer has a molecular weight of 50-1,000,000, specifically 100-100,000, more specifically 500-50,000.

In some embodiments the polymer may be poly(3,4-ethylenedioxythiophene) polystyrene sulfonate (PEDOT:PSS). PEDOT:PSS includes the repeating units represented by the formulas of:

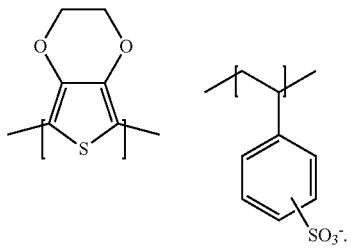

In some embodiments, the polymer of the molding layer 120 may be a copolymer, which includes at least two of the repeating units of Formulas (1)-(8). For examples, the polymer of the molding layer 120 may be poly(acrylic acid-co-acrylamide), poly(methacrylic acid-co-4-vinylphenol), or poly(4-styrenesulfonic acid-co-maleic acid), or a combination thereof. In specifics, the illustrative examples of the copolymer may be represented by the following Formulas (9)-(11):

Formula (9)

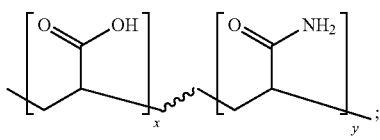

Formula (10)

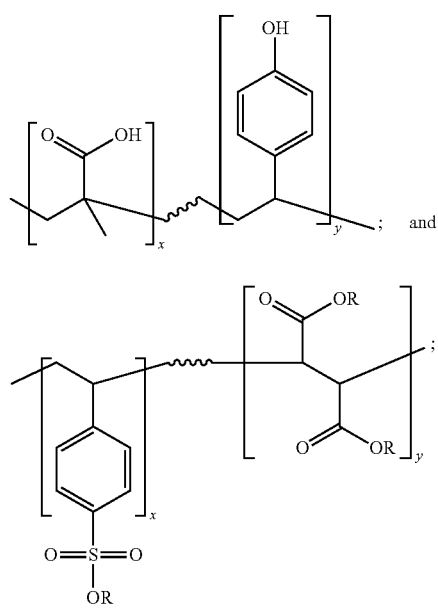

; and

Formula (11)

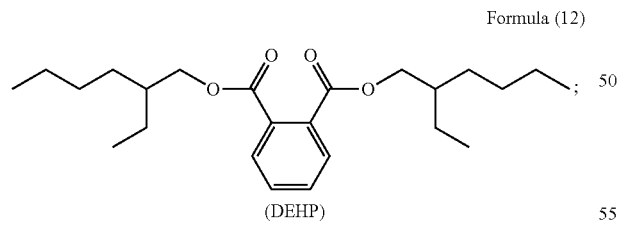

in which the symbol " ~~~~ " represent any connecting group or naught, x is an integral number ranged from 3-20,000, and y is an integral number ranged from 3-20,000. In yet some examples, the copolymer has a molecular weight of 50-1,000,000, specifically 100-100,000, more specifically 500-50,000.

In some embodiments, the polymer of the molding layer 120 may be a blending polymer which includes two or more polymers or copolymers described hereinbefore, e.g., two or more selected from formulas (1)-(11).

In some embodiments, the molding layer 120 may further include a plasticizer. Illustrative examples of the plasticizer includes di(2-ethylhexyl) phthalate (DEHP), diisononyl cyclohexane-1,2-dicarboxylate (DINCH), succinate, maleate, and the like, and a combination thereof. In specifics, the illustrative examples of the plasticizer may be represented by the following Formulas (12)-(15):

Formula (12)

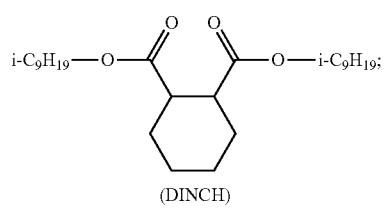

(DEHP)

Formula (13)

i-C$_9$H$_{19}$—O

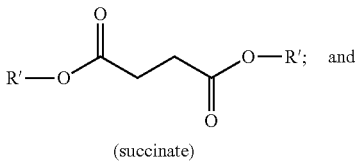

O—i-C$_9$H$_{19}$;

(DINCH)

Formula (14)

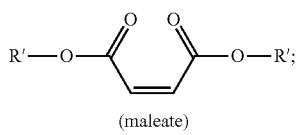

R'—O

O—R'; and

O (succinate)

Formula (15)

R'—O

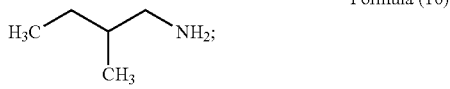

O—R';

(maleate)

in which R and R' independently may be a hydrogen atom, an alkyl group having 1 to 12 carbon atoms, an alkenyl group having 1 to 12 carbon atoms, an alkynyl group having 1 to 12 carbon atoms, an arly group having 1 to 18 carbon atoms, a heterocyclic group having 1 to 18 carbon atoms. R and/or R' may be substituted with at least one of the group selected from a carboxylic group, a hydroxyl group, an aldehyde group, an amine group, an amido group, a sulfide group, a sulfoxide group, and a sulfone group.

In some embodiments, the molding layer 120 may further include a base material that is dispersed in the polymer. The base material may be an organic base. For instance, the organic base may be primary amine, a secondary amine, or a tertiary amine. Illustrative examples of the base material includes ammonium hydroxide (NH4OH), (2-methylbutyl) amine, (3-methylpentyl)amine, 2,4,6-trimethylpyridin-3-amine, 5-methylpyrimidin-2-amine and the like, and a combination thereof. In yet some examples, the base material may be a polymer including functional groups of —NH$_2$, such as poly(vinyl amine). The illustrative examples of the base material may be represented by the following Formulas (16)-(20):

Formula (16)

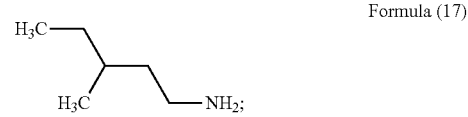

Formula (17)

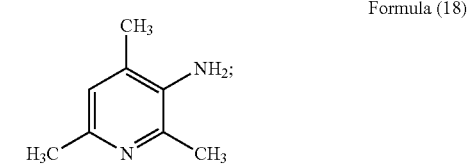

Formula (18)

Formula (19)

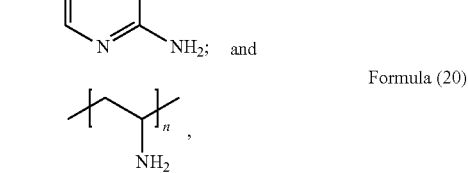

NH$_2$; and

Formula (20)

$\left[\begin{array}{c}\\\\NH_2\end{array}\right]_n$ , in which n is an integral number ranged from 3-20,000.

In some embodiments, the basic groups of the base molecules may be attracted to the acidic groups of the polymer. For example, the polymer with the base material may be represented by the following formulas:

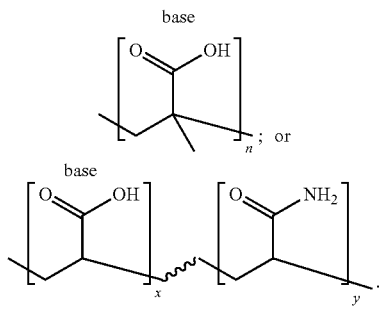

In some embodiments, the molding layer 120 has a glass transition temperature that is greater than or equal to a glass transition temperature of the patterned photoresist layer 110. According to some examples, the glass transition temperature of the molding layer 120 is 10-100° C. higher than that of the patterned photoresist layer 110, specifically 15-70° C. higher than that of the patterned photoresist layer 110, more specifically 20-60° C. higher than that of the patterned photoresist layer 110. For instance, the glass transition temperature of the molding layer 120 may be managed by the selections of the polymer, the base material, and/or the plasticizer. In examples, the glass transition temperature of poly(4-styrenesulfonic acid) is about 106° C. While poly(4-styrenesulfonic acid) is mixed with a suitable amount of ammonium hydroxide, the glass transition temperature thereof may be increased to about 136° C. In addition, when the molding layer 120 includes the base material and the polymer, the base material increases the solubility of the molding layer 120 in several solvents such as water, alcohol, etc. The increase in the solubility of the molding layer 120 is beneficial to the subsequent process. In some embodiments, the molar ratio of the polymer to the base material ranges from 0.01 to 1.3, specifically from 0.05 to 1.0, more specifically from 0.1 to 0.6. According to some examples, when the range of the molar ratio of the polymer to the base material is within the aforementioned range, the molding layer 120 may work an excellent "molding" for the patterned photoresist layer 110 in subsequent operation S13 and may provide sufficient solubility for the subsequent operation S14. According to some examples, when the glass transition temperature of the molding layer 120 is too high, such as for example 100° C. higher than that of the patterned photoresist layer 110, the difficulty of the removal of the molding layer 120 in subsequent process may be increased.

In yet some embodiments, however, the glass transition temperature of the molding layer 120 may be less than that of the patterned photoresist layer 110, which will be described in detail hereinafter in connection with FIGS. 8 and 9.

Figure 6:
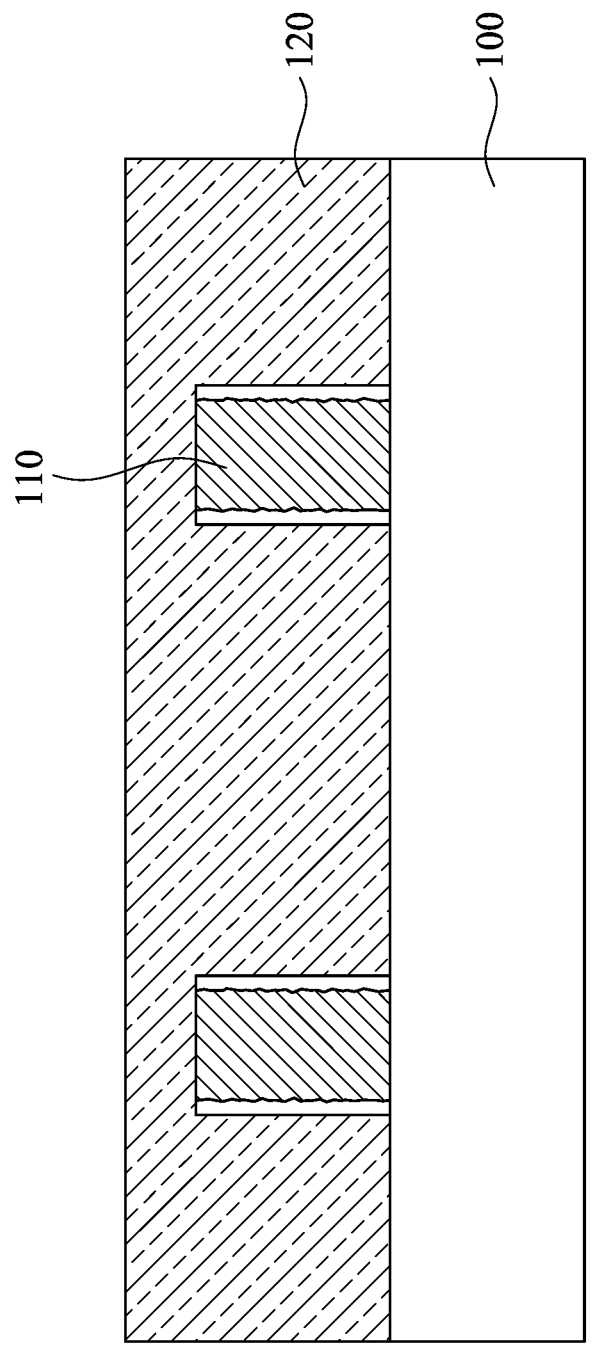

Referring back to FIG. 1, the method 10 proceeds to operation S13 by reflowing the patterned photoresist in the molding layer. FIG. 6 is a cross-sectional view schematically showing the structure after the operation S13 is carried out, according to some embodiments of the present disclosure. The operation S13, for example, may include a step of heating the patterned photoresist layer 110 to reflow the patterned photoresist in the molding layer. In some examples, the patterned photoresist layer 110 is heated at a temperature of greater than a glass transition temperature of the patterned photoresist layer 110, but less than the glass transition temperature of the molding layer 120. In particular, because the patterned photoresist layer 110 is subjected to the temperature of higher than the glass transition temperature, the patterned photoresist layer 110 is soften, and the rough edge of the patterned photoresist layer 110 becomes gentler or flatter due to the tendency toward the lowest free energy. Accordingly, the roughness on the sidewall of the patterned photoresist layer 110 is reduced, and the LER issue may be improved or even remedied. On the other hand, because the glass transition temperature of the molding layer 120 is higher than the heating temperature, the molding layer 120 serves as a hard mold to secure the basic shape (e.g., the top width, bottom width, and/or aspect ratio) of the patterned photoresist layer 110. Consequently, the reflowed patterned photoresist layer 110 with less edge roughness may still function well in the subsequent processes such as etching processes. It is noted that the tiny space 114 (shown in FIG. 5) between the molding layer 120 and the patterned photoresist layer 110 allows the patterned photoresist layer 110 to be microscopically reshaped by the reflowing, even though the molding layer 120 serves as a hard mold.

Figure 7:
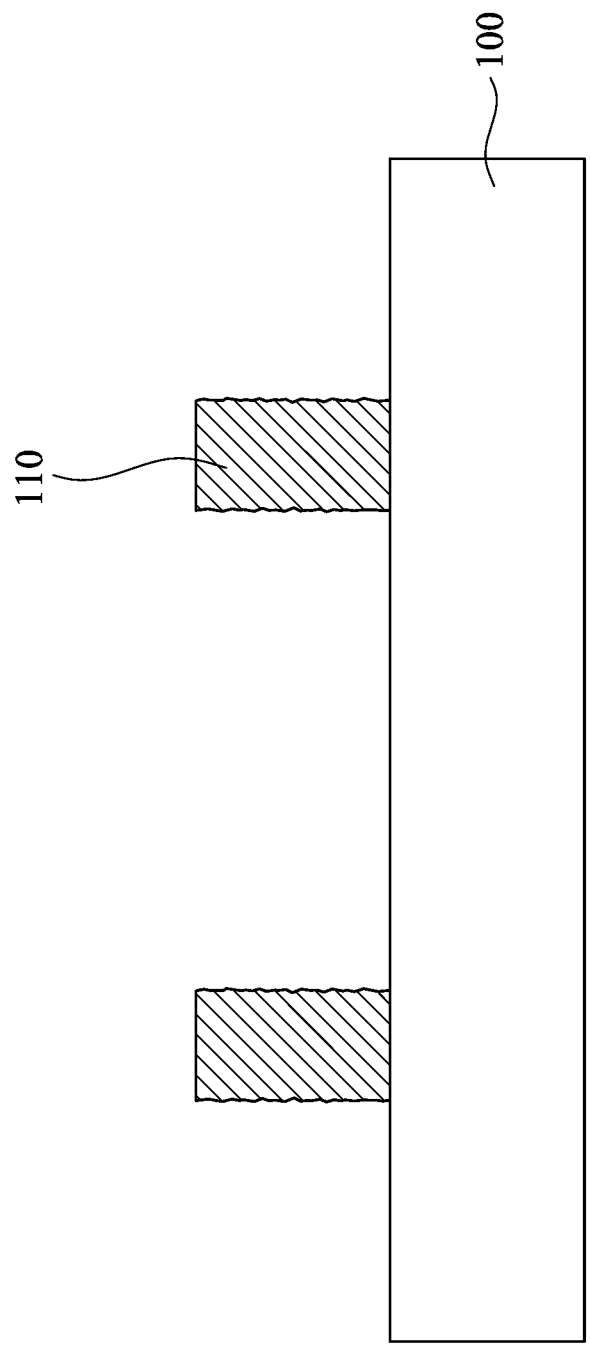

The method 10 proceeds to operation S14 by removing the molding layer 120 from the reflowed patterned photoresist layer 110, as shown in FIG. 7. In some embodiments, the removal of the molding layer 120 includes applying a solvent to dissolve the molding layer 120, whereas the reflowed patterned photoresist layer 110 is not dissolved. As mentioned above, in the embodiments where the molding layer 120 includes the base material, the base material increases the solubility of the molding layer 120 in water, and therefore the molding layer 120 may be dissolved by water in a short time period. In examples, the molding layer 120 includes poly(4-styrenesulfonic acid) and a suitable amount of ammonium hydroxide, and the molding layer 120 may be dissolved in by water within 15 seconds.

The reflowed patterned photoresist layer 110 with less edge roughness may be used in the subsequent etching processes, and the patterned photoresist layer 110 functions well. In examples, the subsequent etching processes may be medium-density plasma etching techniques or high-density plasma etching techniques utilizing inductive, helicon, or electron cyclotron resonance (ECR) plasmas, or other suitable etching techniques such as for example reactive ion etching (RIE) processes.

In comparative examples where the molding layer 120 is not formed covering the patterned photoresist layer 110, the patterned photoresist layer 110 collapses and the shape thereof can not be maintained at an acceptable level.

Figure 8:
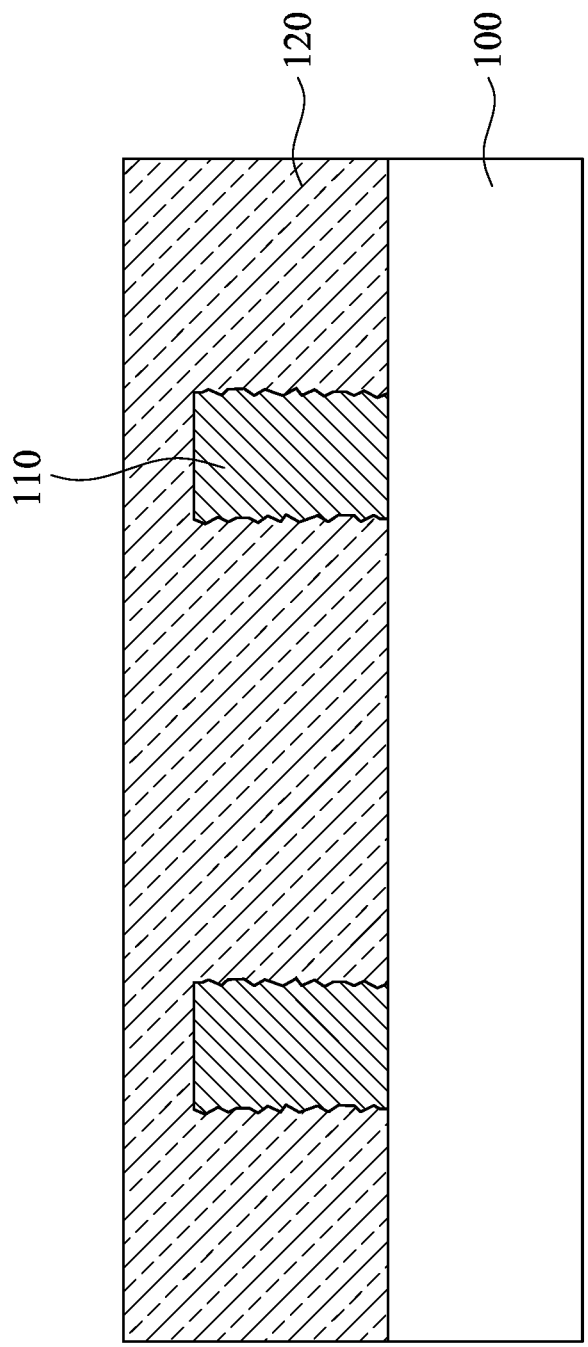
Figure 9:
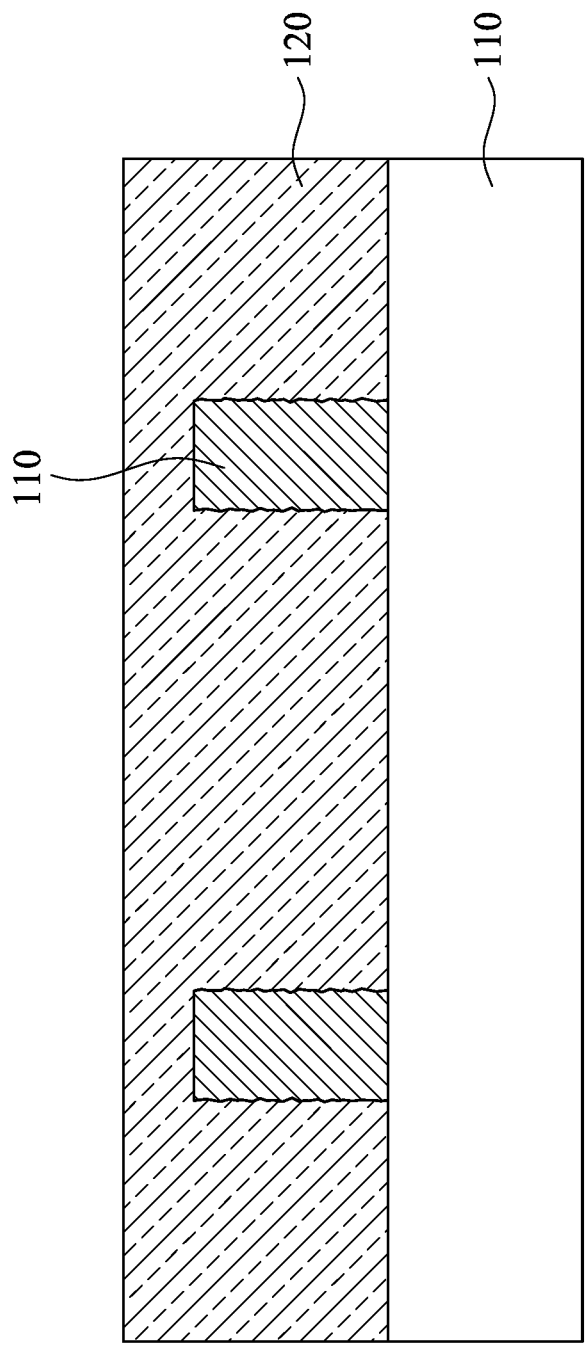

Reference is made to FIG. 8, which schematically shows the formed molding layer 120 after the operation S12 is carried out, according to yet some embodiments. In these embodiments, the tiny space 114 shown in FIG. 5 may not be required. In specifics, the molding solution of forming the molding layer 120 may have a relatively lower surface tension, and the molding solution enters into the micro cavities or recesses on the rough sidewall of the patterned photoresist layer 110. As a result, after the molding solution is dried, the tiny space may not substantially present in between the molding layer 120 and the patterned photoresist layer 110.

As mentioned above, the glass transition temperature of the molding layer 120 may be less than that of the patterned photoresist layer 110 according to yet some embodiments of the present disclosure. Reference is made to FIG. 9, which schematically shows the obtained structure after the operation S13 is performed. When the patterned photoresist layer 110 is heated at a temperature of higher than the glass transition temperature, both the molding layer 120 and the patterned photoresist layer 110 are reflowed because the glass transition temperature of the molding layer 120 is less than that of the patterned photoresist layer 110. However, since the molding layer 120 occupies the major space that surrounds the patterned photoresist layer 110, the molding layer 120 serves as a "resist" to prevents the patterned photoresist layer 110 from significant collapse or flow down. Therefore, the basic shape (e.g., the top width, bottom width, and/or aspect ratio) of the patterned photoresist layer 110 may be secured. On the other hand, since the heating temperature is higher than the glass transition temperatures of both of the patterned photoresist layer 110 and the molding layer 120, both of the materials (i.e., the patterned photoresist layer 110 and the molding layer 120) are soften, and the rough edge of the patterned photoresist layer 110 becomes gentler or flatter. Consequently, the reflowed patterned photoresist layer 110 with less edge roughness may still function well in the subsequent processes such as etching processes. Accordingly, the LER issue is improved or even remedied. In some examples, the molding layer 120 has a glass transition temperature that is 3-30° C. less than the glass transition temperature of the patterned photoresist layer 110. For example, the glass transition temperature of the molding layer 120 is 5° C., 10° C., 15° C., 20° C., or 25° C. less than the glass transition temperature of the patterned photoresist layer 110. According to some examples, when the glass transition temperature of the molding layer 120 is too low, such as for example 40° C. less than that of the patterned photoresist layer 110, the "molding" function of the molding layer 120 is unsatisfied.

Figure 10:
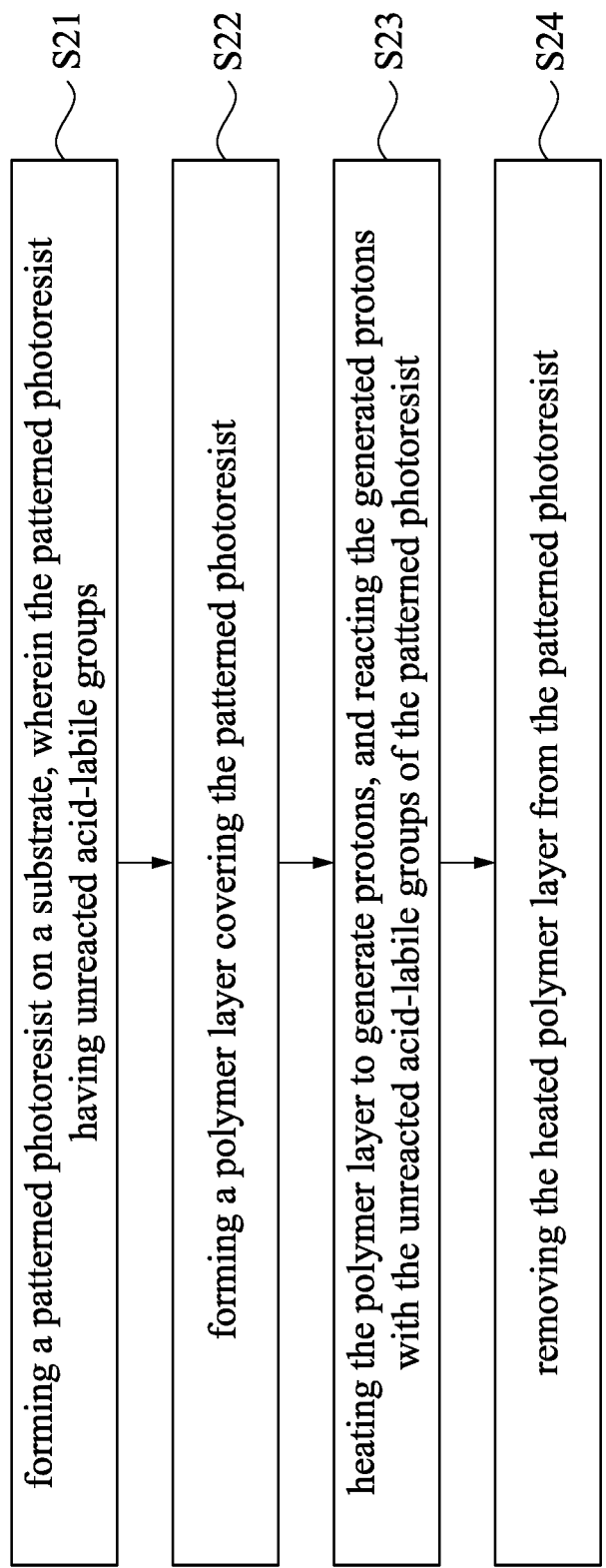
FIG. 10 is a flow chart illustrating a method according to yet various embodiments of the present disclosure.

FIG. 10 is a flow chart illustrating a method 20 according to yet various embodiments of the present disclosure. FIGS. 11-15 schematically depict the cross-sectional views in various process stages of the method 20. The method 20 includes an operation S21 of forming a patterned photoresist on a substrate, in which the patterned photoresist has unreacted acid-labile groups. The implementation of the patterned photoresist layer 110 described hereinbefore in connection with the operation S11 and FIGS. 2-3 may equally applied to the operation S21, according to some embodiments. Therefore, the description of the operation S21 is omitted herein to avoid repetition. In specifics, the rough edge or sidewall of the patterned photoresist layer 110 has a number of micro protrusions and micro cavities (or recesses), as described hereinbefore.

Figure 11:
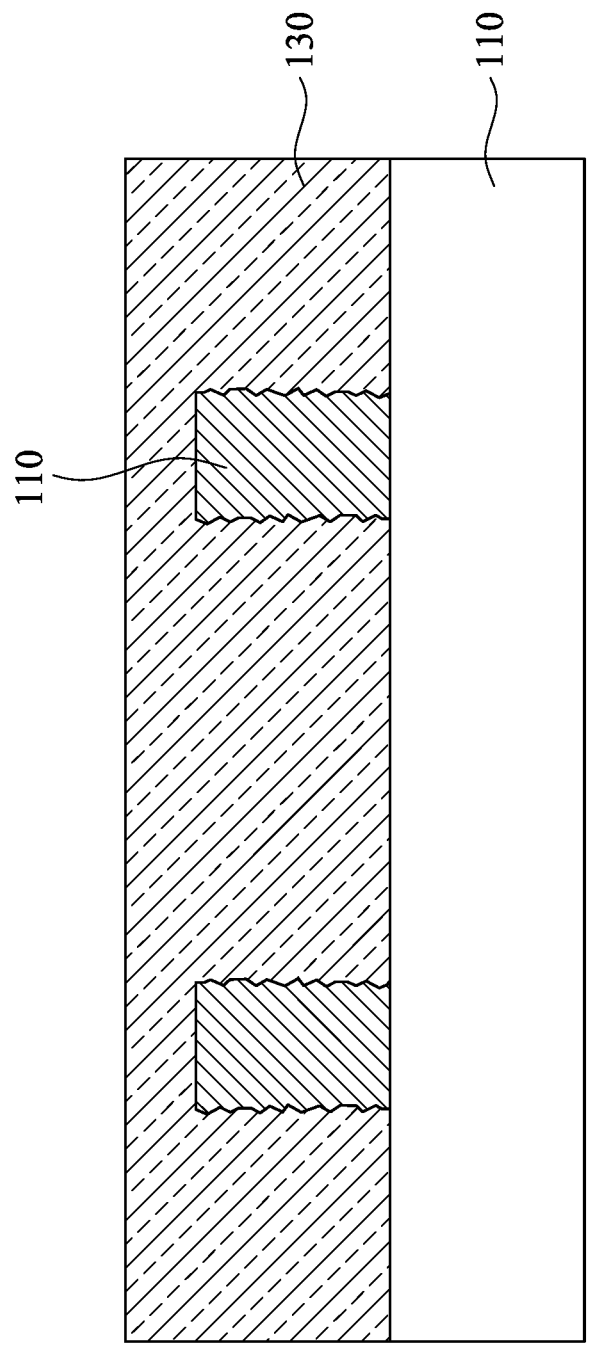

The method 20 proceeds to operation S22 by forming a polymer layer covering the patterned photoresist. In some embodiments, a polymer solution may be applied (e.g., coating) onto the substrate 100 to form a layer of polymer solution covering the patterned photoresist layer 110. Thereafter, a drying process may be carried out to remove the solvent of the polymer solution. Therefore, as shown in FIG. 11, a dried polymer layer 130 is formed covering the patterned photoresist layer 110 on the substrate 100. In examples, the polymer solution of forming the polymer layer 130 may have a relatively lower surface tension, and the polymer solution enters into the micro cavities or recesses on the rough sidewall of the patterned photoresist layer 110. As a result, after the polymer solution is dried, the micro cavities (or recesses) of the patterned photoresist layer 110 are substantially filled up and the tiny space is not substantially present in between the polymer layer 130 and the patterned photoresist layer 110. Therefore, the polymer layer 130 is in contact with and surrounds the patterned photoresist layer 110. In some embodiments, the polymer layer 130 is capable of producing or generating protons. For example, when the polymer layer 130 is heated, the function groups of the polymer layer 130 produces or releases protons. Illustrative examples of the polymers capable of producing or generating protons include polymers having functional group of —SO₃H, and/or —SO₃R, in which R is a leaving group when being heated. For example, R may be —Na or —O—(CH₃)₃. In example, the polymer layer 130 may include a polymer represented by the following formulas:

Formula (1)

Formula (2)

Formula (7)

Formula (8)

In some embodiments, the polymer layer 130 may include poly(3,4-ethylenedioxythiophene) polystyrene sulfonate (PEDOT:PSS).

In some embodiments, the polymer layer 130 may a copolymer, which includes at least one of the repeating unit of Formulas (1), (2), (7) and (8) and another repeating unit of Formulas (3), (4), (5), and (6).

In some embodiments, the polymer of the polymer layer 130 may be a blending polymer which includes two or more polymers or copolymers described above in connection with the polymer layer 130.

In some embodiments, the polymer layer 130 may further include a plasticizer. Illustrative examples of the plasticizer includes di(2-ethylhexyl) phthalate (DEHP), diisononyl cyclohexane-1,2-dicarboxylate (DINCH), succinate, maleate, and the like, and a combination thereof. The plasticizer may function to adjust the glass transition temperature of the polymer layer.

In some embodiments, the polymer layer 130 is substantially free of a base substance which neutralizes acid or protons.

Figure 12:
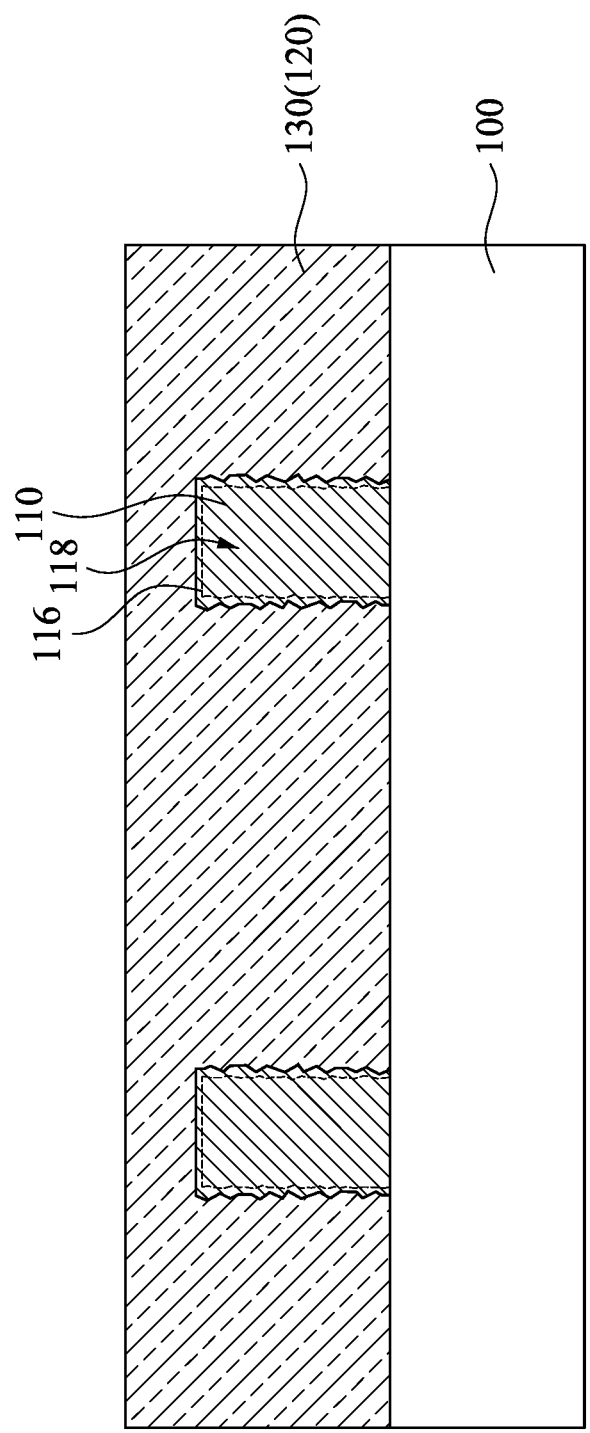

The method 20 proceeds to operation S23 by heating the polymer layer to produce protons (H⁺), and further reacting the produced protons with the unreacted acid-labile groups of the patterned photoresist. In some embodiments, the unreacted acid-labile groups are hydrophobic, and the surface of the patterned photoresist with the unreacted acid-labile groups is hydrophobic. As shown in FIG. 12, when the polymer layer 130 is heated, the polymer layer 130 is capable of producing protons (H$^+$). The produced protons (H$^+$) react with the hydrophobic acid-labile groups on the surface of the patterned photoresist layer 110 such that at least portions of the hydrophobic acid-labile groups are transformed into hydrophilic groups. Consequently, a hydrophilic portion 116 is formed on the surface of the patterned photoresist layer 110.

Reference is made to FIG. 13, which illustrates more details regarding the reaction of acid-labile groups (ALGs) according to some examples. As illustrated, the polymer layer 130 are shown by the formula of:

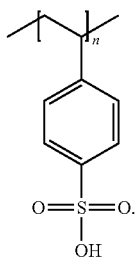

Figure 14:
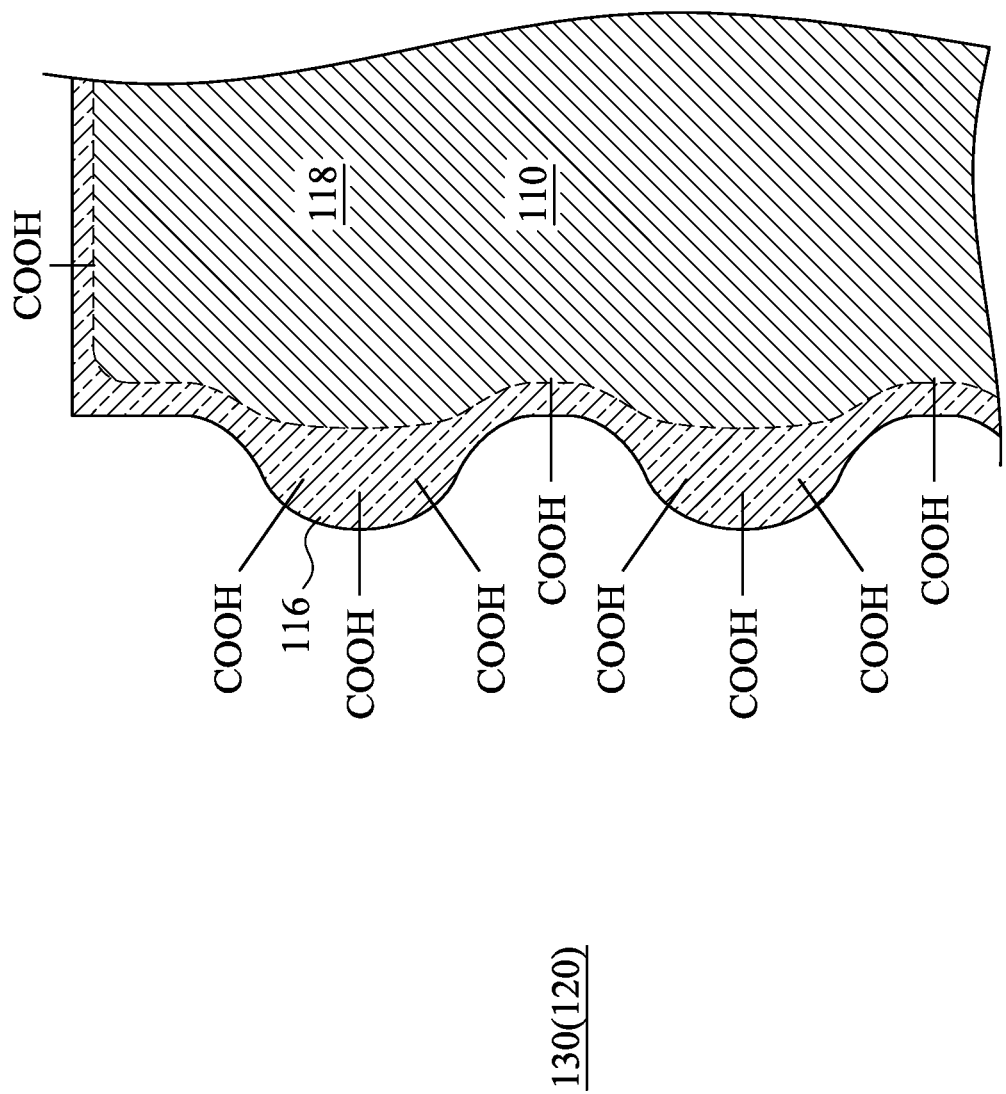

When the polymer layer 130 is heated, the polymer layer 130 produces protons (H$^+$). The protons (H$^+$) is then reacted with the hydrophobic ALGs on the surface of the patterned photoresist layer 110, and therefore the hydrophobic ALGs is converted into hydrophilic groups such as —COOH, as shown FIG. 14. Consequently, the hydrophilic portion 116 is formed on the surface of the patterned photoresist layer 110. It is noted that the inner portion 118, covered by the hydrophilic portion 116, is still hydrophobic because the diffusion of the protons (H$^+$) is controlled to be limited to a certain distance from the surface of the patterned photoresist layer 110. Furthermore, the protrusive portions of the patterned photoresist layer 110 have a thicker hydrophilic region, as compared to the cavities or recessed portions, because the protrusive portions provide a relatively larger contact area with the polymer layer 130. Accordingly, the inner hydrophobic portion 118 has a smaller roughness, as shown in FIG. 14.

According to some embodiments of the present disclosure, in the operation S23 of heating the polymer layer 130 to produce the protons (H$^+$), the patterned photoresist layer 110 may concurrently be reflowed in the polymer layer 130. In specifics, the polymer layer 130 may be heated to a temperature that is greater than the glass transition temperature of the patterned photoresist layer 110, and therefore the patterned photoresist layer 110 may be reflowed concurrently. Alternatively, another heating step may be performed to reflow the patterned photoresist layer 110 after the operation S23 is carried out. Therefore, the roughness of the sidewall of the patterned photoresist layer 110 may be reduced during or after the operation S23. It is noted that the glass transition temperature of the polymer layer 130 may be less than, substantially equal to, or greater than that of the patterned photoresist layer 110. Furthermore, the polymer layer 130 may also be referred to as a molding layer 120 in some embodiments described hereinafter.

Figure 15:
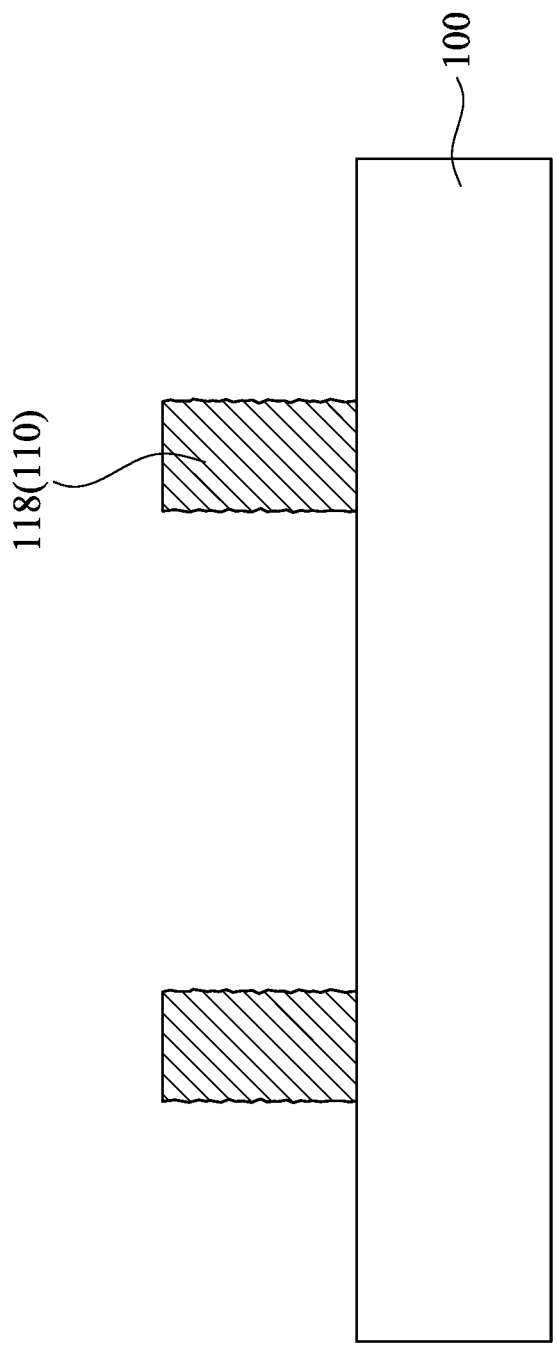

The method 20 proceeds to operation S24 by removing the polymer layer from the patterned photoresist. In some embodiments, as shown in FIG. 15, the removal of the polymer layer 130 includes applying a solvent to dissolve the polymer layer 130 and the hydrophilic portion 116 on the surface of the patterned photoresist layer 110, but the inner portion 118 of the patterned photoresist layer 110 is not dissolved. After the hydrophilic portion 116 of the patterned photoresist layer 110 and the polymer layer 130 are removed, the inner portion 118 of the patterned photoresist layer 110 is exposed. As discussed above, the inner portion 118 has a smaller roughness on the sidewall, and therefore the LER issue of the patterned photoresist layer 110 is improved or even remedied. Stated differently, the removal of the polymer layer 130 may reduce the roughness on the sidewall of the patterned photoresist layer 110, according to some embodiments.

Figure 16:
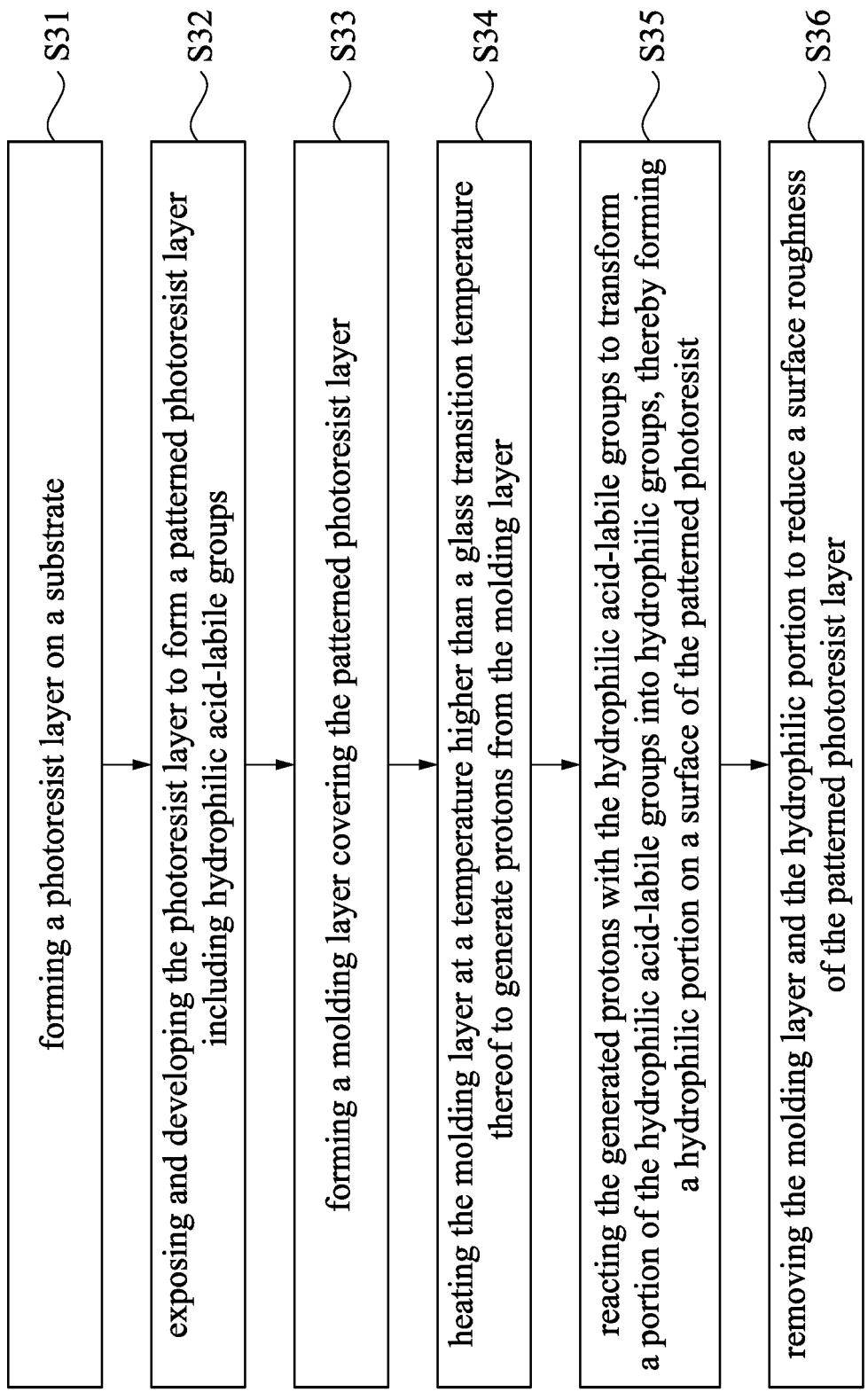
FIG. 16 is a flow chart illustrating a method according to yet some embodiments of the present disclosure.

According to yet some embodiments, the method 10 of FIG. 1 and the method 20 of FIG. 10 may be combined together. FIG. 16 is a flow chart illustrating a method 30 according to some embodiments of the present disclosure, which include features of method 10 and method 20.

The method 30 includes operation S31 of forming a photoresist layer 106 on a substrate 100, as shown in FIG. 2. In examples, a photoresist solution may be applied (e.g., coating) on the substrate 100, and followed by a drying process to remove the solvent in the photoresist solution. Accordingly, the photoresist layer 106 is blanketly formed on the substrate 100.

The method 30 further includes operation S32 of exposing and developing the photoresist layer 106 to form a patterned photoresist layer 110, as shown in FIG. 3. The patterned photoresist layer 110 includes hydrophobic acid-labile groups.

The method 30 further includes operation S33 of forming a molding layer 120 covering the patterned photoresist layer 110, as shown in FIG. 5, in which the depicted space 114 may or may not appear. According to some embodiments of the present disclosure, the molding layer 120 has a glass transition temperature that is greater than or equal to a glass transition temperature of the patterned photoresist layer 110. In some embodiments, however, the glass transition temperature of the molding layer 120 is 10° C.-30° C. less than the glass transition temperature of the patterned photoresist layer 110.

The method 30 further includes operation S34 of heating the molding layer 120 at a temperature higher than a glass transition temperature thereof to generate protons (H$^+$) from the molding layer 120. In some embodiments, the molding layer 120 is heated to the temperature that is greater than glass transition temperatures of both the molding layer 120 and the patterned photoresist layer 110. In yet some embodiments, the molding layer 120 is heated to the temperature that is greater than the glass transition temperatures of the molding layer 120, but less than the glass transition temperature of the patterned photoresist layer 110.

The method 30 further includes operation S35 of reacting the generated protons from the molding layer 120 with the hydrophobic acid-labile groups of the patterned photoresist layer 110, as shown in FIGS. 12-14. The operation S35 further includes transforming a portion of the hydrophobic acid-labile groups into hydrophilic groups, and therefore a hydrophilic portion 116 is formed on a surface of the patterned photoresist layer 110. The embodiments of operation S23 in the method 20 may be equally applied to the operation S35 described herein, and therefore the details of the operation S35 are not repeated herein.

The method 30 further includes operation S36 of, as shown in FIG. 15, removing the molding layer 120 and the hydrophilic portion 116 on the surface of the patterned photoresist layer 110 to reduce a surface roughness of the patterned photoresist layer 110. According to some embodiments of the present disclosure, the removal of the molding layer 120 and the hydrophilic portion 116 on the surface of the patterned photoresist layer 110 includes applying a solvent to dissolve the molding layer 120 and the hydrophilic portion 116 on the surface of the patterned photoresist layer 110.

In accordance with one aspect of some embodiments, a method of forming a patterned masking layer (e.g., photoresist) includes the following operations: (i) forming a patterned photoresist on a substrate; (ii) forming a molding layer covering the patterned photoresist; (iii) reflowing the patterned photoresist in the molding layer; and (iv) removing the molding layer from the reflowed patterned photoresist.

In some embodiments, the operation of reflowing the patterned photoresist includes heating the patterned photoresist at a temperature of greater than a glass transition temperature of the patterned photoresist.

In some embodiments, the molding layer has a glass transition temperature that is greater than or equal to the glass transition temperature of the patterned photoresist.

In some embodiments, the molding layer has a glass transition temperature that is 3° C.-30° C. less than the glass transition temperature of the patterned photoresist.

In some embodiments, the operation of reflowing the patterned photoresist includes reducing a roughness on a sidewall of the patterned photoresist.

In some embodiments, the molding layer includes a polymer having a repeating unit including at least one of a hydroxyl functionality, a carboxylate functionality, a carboxylic acid functionality, an amine functionality, and an amide functionality.

In some embodiments, the molding layer further includes a base material dispersed in the polymer, and the base material includes ammonium hydroxide, (2-Methylbutyl) amine, (3-Methylpentyl)amine, 2,4,6-Trimethylpyridin-3-amine, or 5-methylpyrimidin-2-amine, or a combination thereof.

In some embodiments, the molding layer further includes a plasticizer selected from the group consisting of di(2-ethylhexyl) phthalate (DEHP), diisononyl cyclohexane-1,2-dicarboxylate (DINCH), succinate, and maleate.

In some embodiments, the patterned photoresist includes a plurality of apertures exposing the substrate, and the operation of forming the molding layer covering the patterned photoresist includes filling up the apertures with the molding layer.

In some embodiments, the operation of reflowing the patterned photoresist in the molding layer includes heating the patterned photoresist and producing protons from the molding layer.

In accordance with one aspect of some embodiments, a method of reshaping a patterned photoresist includes the following operations: (i) forming a patterned photoresist on a substrate, wherein the patterned photoresist has unreacted acid-labile groups; (ii) forming a polymer layer covering the patterned photoresist; (iii) heating the polymer layer to produce protons, and reacting the produced protons with the unreacted acid-labile groups of the patterned photoresist; and (iv) removing the heated polymer layer from the patterned photoresist after the heating the polymer layer to produce the protons.

In some embodiments, the method further includes reflowing the patterned photoresist in the polymer layer after or during the operation of heating the polymer layer but prior to the operation of removing the heated polymer layer from the patterned photoresist.

In some embodiments, the operation of reflowing the patterned photoresist in the polymer layer includes reducing a roughness on a sidewall of the patterned photoresist.

In some embodiments, the unreacted acid-labile groups are hydrophobic, and the reacting the produced protons with the unreacted acid-labile groups of the patterned photoresist includes transforming a portion of the unreacted acid-labile groups into hydrophilic groups, thereby forming a hydrophilic portion on a surface of the patterned photoresist.

In some embodiments, the operation of removing the heated polymer layer from the patterned photoresist includes reducing a roughness on a sidewall of the patterned photoresist.

In some embodiments, the operation of removing the heated polymer layer from the patterned photoresist includes applying a solvent to dissolve the heated polymer layer and the hydrophilic portion on the surface of the patterned photoresist.

In accordance with one aspect of some embodiments, a method of forming a patterned photoresist includes the following operations: (i) forming a photoresist layer on a substrate; (ii) exposing and developing the photoresist layer to form a patterned photoresist layer including hydrophobic acid-labile groups; (iii) forming a molding layer covering the patterned photoresist layer; (iv) heating the molding layer at a temperature higher than a glass transition temperature thereof to produce protons from the molding layer; (v) reacting the produced protons from the molding layer with the hydrophobic acid-labile groups of the patterned photoresist layer to transform a portion of the hydrophobic acid-labile groups into hydrophilic groups, thereby forming a hydrophilic portion on a surface of the patterned photoresist layer; and (vi) removing the molding layer and the hydrophilic portion on the surface of the patterned photoresist layer to reduce a surface roughness of the patterned photoresist layer.

In some embodiments, the molding layer has a glass transition temperature that is greater than or equal to a glass transition temperature of the patterned photoresist layer.

In some embodiments, the molding layer has a glass transition temperature that is 10° C.-30° C. less than a glass transition temperature of the patterned photoresist layer.

In some embodiments, the removing the molding layer and the hydrophilic portion on the surface of the patterned photoresist layer includes applying a solvent to dissolve the molding layer and the hydrophilic portion on the surface of the patterned photoresist layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
coating a photoresist layer on a substrate;
performing an exposure process to the photoresist layer such that the photoresist layer comprises an exposed portion;
performing a developing process to remove the exposed portion to form a patterned photoresist on the substrate;
after performing the developing process, forming a molding layer covering the patterned photoresist;
reflowing the patterned photoresist in the molding layer; and
removing the molding layer from the reflowed patterned photoresist, wherein the reflowing the patterned photoresist comprises:
heating the patterned photoresist at a temperature greater than a glass transition temperature of the patterned photoresist.

2. The method according to claim 1, wherein the molding layer has a glass transition temperature that is greater than or equal to the glass transition temperature of the patterned photoresist.

3. The method according to claim 1, wherein the molding layer has a glass transition temperature that is 3° C. -30° C. less than the glass transition temperature of the patterned photoresist.

4. The method according to claim 1, wherein the reflowing the patterned photoresist comprises reducing a roughness on a sidewall of the patterned photoresist.

5. The method according to claim 1, wherein the molding layer comprises a polymer having a repeating unit comprising at least one of a hydroxyl functionality, a carboxylate functionality, a carboxylic acid functionality, an amine functionality, and an amide functionality.

6. The method according to claim 5, wherein the molding layer further comprises a base material, and the base material comprises ammonium hydroxide, (2-Methylbutyl)amine, (3-Methylpentyl)amine, 2,4,6-Trimethylpyridin-3-amine, or 5-methylpyrimidin-2-amine, or a combination thereof.

7. The method according to claim 5, wherein the molding layer further comprises a plasticizer selected from the group consisting of di(2-ethylhexyl) phthalate (DEHP), diisononyl cyclohexane-1,2-dicarboxylate (DINCH), succinate, and maleate.

8. The method according to claim 1, wherein the patterned photoresist comprises a plurality of apertures exposing the substrate, and the forming the molding layer covering the patterned photoresist comprises filling up the apertures with the molding layer.

9. The method according to claim 1, wherein the reflowing the patterned photoresist in the molding layer comprises heating the patterned photoresist and producing protons from the molding layer.

10. A method, comprising:
coating a photoresist layer on a substrate;
performing an exposure process to the photoresist layer such that the photoresist layer comprises an exposed portion;
performing a developing process to remove the exposed portion to form a patterned photoresist on the substrate, wherein the patterned photoresist has unreacted acid-labile groups;
after performing the developing process, forming a polymer layer covering the patterned photoresist, wherein the polymer layer has a glass transition temperature higher than or equal to a glass transition temperature of the patterned photoresist;
after forming the polymer layer covering the patterned photoresist, heating the polymer layer and the patterned photoresist such that the polymer layer produces protons, and reacting the produced protons with the unreacted acid-labile groups of the patterned photoresist, wherein the unreacted acid-labile groups are hydrophobic, and the reacting the produced protons with the unreacted acid-labile groups of the patterned photoresist comprises transforming a portion of the unreacted acid-labile groups into hydrophilic groups, thereby forming a hydrophilic portion on a surface of the patterned photoresist; and
removing the heated polymer layer from the patterned photoresist after the heating the polymer layer to produce the protons.

11. The method according to claim 10, further comprising reflowing the patterned photoresist in the polymer layer after or during heating the polymer layer but prior to the removing the heated polymer layer from the patterned photoresist.

12. The method according to claim 11, wherein the reflowing the patterned photoresist in the polymer layer comprises reducing a roughness on a sidewall of the patterned photoresist.

13. The method according to claim 10, wherein the removing the heated polymer layer from the patterned photoresist comprises reducing a roughness on a sidewall of the patterned photoresist.

14. The method according to claim 10, wherein the removing the heated polymer layer from the patterned photoresist comprises applying a solvent to dissolve the heated polymer layer and the hydrophilic portion on the surface of the patterned photoresist.

15. The method according to claim 10, wherein the hydrophilic portion on the surface of the patterned photoresist is functionalized with a carboxyl group.

16. A method, comprising:
forming a photoresist layer on a substrate;
exposing and developing the photoresist layer to form a patterned photoresist layer including hydrophobic acid-labile groups;
after exposing and developing the photoresist layer to form the patterned photoresist layer, forming a molding layer covering the patterned photoresist layer;
heating the molding layer at a temperature higher than a glass transition temperature of the patterned photoresist layer thereof to produce protons from the molding layer;
reacting the produced protons from the molding layer with the hydrophobic acid-labile groups of the patterned photoresist layer to transform a portion of the hydrophobic acid-labile groups into hydrophilic groups, thereby forming a hydrophilic portion on a surface of the patterned photoresist layer; and
removing the molding layer and the hydrophilic portion on the surface of the patterned photoresist layer to reduce a surface roughness of the patterned photoresist layer.

17. The method according to claim 16, wherein the molding layer has a glass transition temperature that is greater than or equal to the glass transition temperature of the patterned photoresist layer.

18. The method according to claim 16, wherein the molding layer has a glass transition temperature that is 10° C-30° C. less than the glass transition temperature of the patterned photoresist layer.

19. The method according to claim 16, wherein the removing the molding layer and the hydrophilic portion on the surface of the patterned photoresist layer comprises applying a solvent to dissolve the molding layer and the hydrophilic portion on the surface of the patterned photoresist layer.

20. The method according to claim 16, wherein after forming the molding layer covering the patterned photoresist layer, the molding layer and the patterned photoresist layer have a space therebetween, and heating the molding layer is performed such that the space allows the patterned photoresist layer to reshape.

* * * * *